US009653282B2

(12) United States Patent
Yan et al.

(10) Patent No.: US 9,653,282 B2
(45) Date of Patent: May 16, 2017

(54) SILICON-CONTAINING SUBSTRATE CLEANING PROCEDURE

(71) Applicant: Applied Materials, Inc., Santa Clara, CA (US)

(72) Inventors: Chun Yan, San Jose, CA (US); Xinyu Bao, Mountain View, CA (US); Melitta Manyin Hon, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 102 days.

(21) Appl. No.: 14/445,410

(22) Filed: Jul. 29, 2014

(65) Prior Publication Data

US 2016/0035562 A1   Feb. 4, 2016

(51) Int. Cl.
*H01L 21/02* (2006.01)

(52) U.S. Cl.
CPC .. *H01L 21/02046* (2013.01); *H01L 21/02381* (2013.01); *H01L 21/02532* (2013.01); *H01L 21/02658* (2013.01)

(58) Field of Classification Search
CPC ............................................... H01L 21/02046
See application file for complete search history.

(56) References Cited

U.S. PATENT DOCUMENTS

| 6,494,959 | B1 | 12/2002 | Samoilov et al. |
| 8,123,858 | B2 | 2/2012 | Wang et al. |
| 8,309,440 | B2 | 11/2012 | Sanchez et al. |
| 8,466,049 | B2 | 6/2013 | Inokuchi et al. |
| 2001/0003015 | A1* | 6/2001 | Chang ............... C23C 16/0245 427/569 |
| 2006/0169668 | A1* | 8/2006 | Samoilov ............ B08B 7/0035 216/58 |
| 2008/0274610 | A1* | 11/2008 | Choi ................ H01L 21/76846 438/653 |
| 2009/0029528 | A1 | 1/2009 | Sanchez et al. |
| 2012/0000490 | A1 | 1/2012 | Chung et al. |
| 2012/0196447 | A1* | 8/2012 | Yang ................ H01L 21/31116 438/734 |
| 2012/0312326 | A1 | 12/2012 | Chatterjee et al. |
| 2013/0068390 | A1 | 3/2013 | Sanchez et al. |

FOREIGN PATENT DOCUMENTS

| WO | 2009014894 A1 | 1/2009 |
| WO | 2012170511 A2 | 12/2012 |

* cited by examiner

*Primary Examiner* — Daniel Luke
(74) *Attorney, Agent, or Firm* — Patterson + Sheridan, LLP

(57) ABSTRACT

A method for cleaning a substrate, such as a silicon substrate, a silicon-germanium substrate, or other silicon-containing substrate is disclosed. The method includes exposing the substrate to a first plasma configured to attack a sub-oxide on the substrate. The method also includes exposing the substrate to a second plasma configured to attack the native oxide on the substrate. The method further includes exposing the substrate to a gas containing at least one of molecular chlorine or a chlorine compound. The gas may be configured to remove at least some of the remaining native oxide and sub-oxide. After the cleaning process, the substrate may be further processed. Further processing steps may include, for example, an epitaxial growth process. An epitaxial growth process performed on a substrate cleaned according to the methods disclosed herein will exhibit few defects.

17 Claims, 4 Drawing Sheets

SILICON-CONTAINING SUBSTRATE CLEANING PROCEDURE

BACKGROUND

Field

The present disclosure generally relates to methods for processing a substrate, and more specifically to methods for cleaning a substrate.

Description of the Related Art

Epitaxial growth technology is widely applied in manufacturing of semiconductor devices, display devices, and other devices. Typically, when epitaxial growth technology is used to form an epitaxial layer on a semiconductor substrate, the crystalline orientation of the epitaxial layer is almost the same as that of the semiconductor substrate. Before the epitaxial layer is deposited on the substrate, a surface cleaning process is typically performed to remove native oxides and/or other impurities from the deposition surface, e.g., surface of the semiconductor substrate. The surface cleaning process is typically employed to increase the quality of the epitaxial layer being formed. However, current cleaning processes may not be suitable for reliable fabrication of next-generation devices.

Accordingly, there is a need in the art for improved methods for cleaning a substrate.

SUMMARY

Embodiments disclosed herein include a method for processing a substrate. The method includes exposing a substrate having a silicon-containing layer to a first plasma generated from a gas containing at least one of hydrogen or a hydrogen compound. The method also includes exposing the silicon-containing layer to a second plasma generated from a nitrogen compound. The method also includes heating the substrate and exposing the silicon-containing layer to a gas containing at least one of molecular chlorine or a chlorine compound.

Other embodiments disclosed herein include a method for processing a substrate. The method includes positioning a substrate having a silicon-containing layer in a processing chamber. The method includes breaking Si—Si bonds below the surface of the silicon-containing layer. The method also includes selectively removing a sub-oxide underlying the surface of the silicon-containing layer. The method further includes removing native oxide from the surface of the silicon-containing layer.

Other embodiments disclosed herein include a semiconductor substrate. The substrate includes a silicon-containing layer having patterned features formed therein. The surface of the patterned features has an oxygen concentration of less than $1.30 \times 10^{11}$ (atoms)/cm$^2$.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

The present disclosure generally relates to a method for cleaning a substrate, such as a silicon substrate, a silicon-germanium substrate, or other silicon-containing substrate. The method includes exposing the substrate to a first plasma. The first plasma may be configured to attack a sub-oxide on the substrate. The method also includes exposing the substrate to a second plasma. The second plasma may be configured to attack the native oxide on the substrate. The method further includes exposing the substrate to a gas containing at least one of molecular chlorine or a chlorine compound. The gas may be configured to remove at least some of the remaining native oxide and sub-oxide. After the cleaning process, the substrate may be further processed. Further processing steps may include, for example, an epitaxial growth process. An epitaxial growth process performed on a substrate cleaned according to the methods disclosed herein will exhibit few defects. The lack of defects may be attributed to the effectiveness of the cleaning process. For example, the substrate may have a surface oxygen concentration of less than about $1.30 \times 10^{11}$ (atoms)/cm$^2$.

Figure 1A:
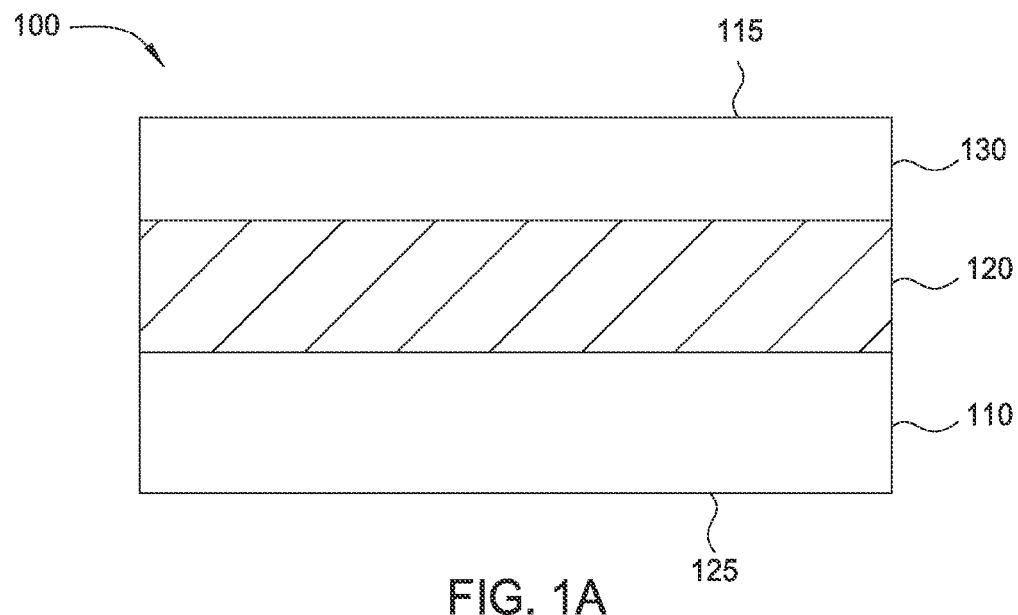
FIG. 1A is a schematic cross-sectional view of one embodiment of a substrate prior to being processed according to embodiments disclosed herein.
Figure 1B:
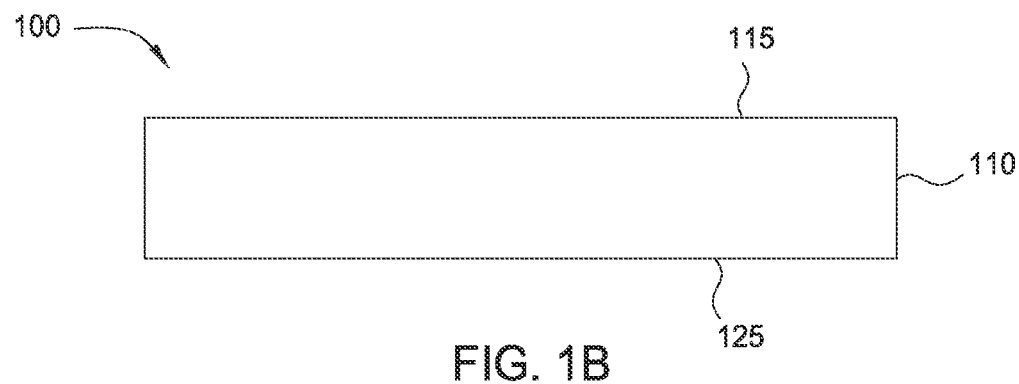
FIG. 1B is a schematic cross-sectional view of one embodiment of the substrate of FIG. 1A that has been processed according to one or more embodiments disclosed herein.
Figure 1C:
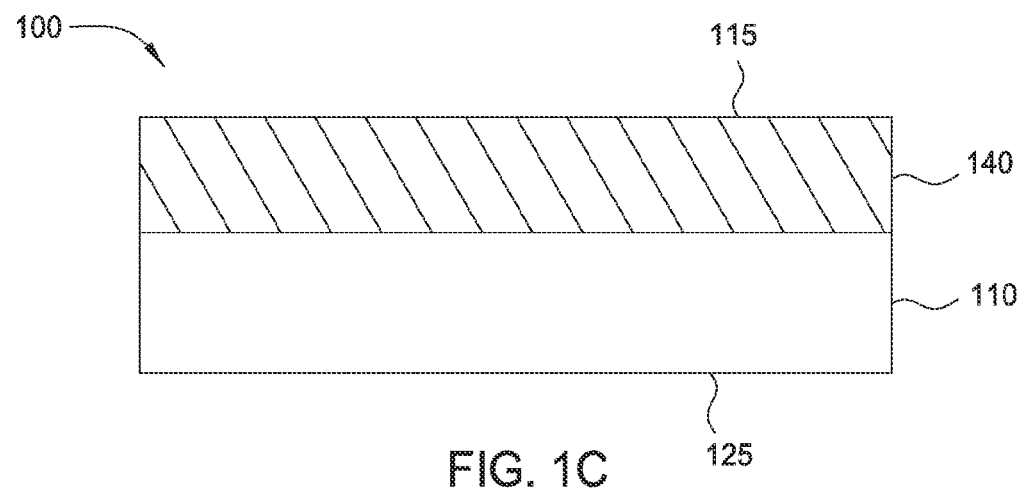
FIG. 1C is a schematic cross-sectional view of one embodiment of the substrate of FIG. 1B that has been processed according to one or more embodiments disclosed herein.

FIGS. 1A-1C illustrate a substrate 100 during different stages of embodiments disclosed herein. FIG. 1A illustrates a substrate 100 prior to processing. Prior to processing, the substrate 100 may comprise silicon and oxygen. In other embodiments, the substrate 100 may consist essentially of silicon and oxygen prior to processing. In still other embodiments, the substrate 100 may comprise silicon, germanium, and oxygen prior to processing. In further embodiments, the substrate 100 may consist essentially of silicon, germanium, and oxygen prior to processing.

As shown, the substrate 100 has a substrate layer 110, a sub-oxide layer 120, and a native oxide layer 130. Also as shown, the substrate 100 has a first surface 115 and a second surface 125. The first surface 115 is opposite the second surface 125. The first surface 115 may be an outermost surface. As shown, the first surface 115 and the second surface 125 are flat. In other embodiments, the first surface 115 and the second surface 125 may be patterned. The pattern may include features, such as lines, trenches, vias, or other features. The features on the first surface 115 may be formed in the substrate layer 110, the sub-oxide layer 120, and/or the native oxide layer 130. The features formed in the first surface 115 and the second surface 125 may have any desired size. For example, the feature size may be on the nano-scale or on the micro scale. In some embodiments, the feature size may be between about 10 nm and about 100 nm. In other embodiments, the feature size may be smaller than about 10 nm or greater than about 100 nm.

The substrate layer 110 may be a silicon-containing layer. In some embodiments, the substrate layer 110 may comprise silicon, germanium, or silicon and germanium. In some embodiments, the substrate layer 110 may have silicon-silicon (Si—Si) bonds. In some embodiments, the substrate layer 110 is crystalline. The substrate layer 110 may be mono-crystalline or polycrystalline. In some embodiments, the substrate layer 110 consists essentially of silicon, consists essentially of germanium, or consists essentially of silicon and germanium.

The sub-oxide layer 120 may include one or more mono-oxides. For example, the sub-oxide layer 120 may include at least one of silicon oxide (SiO) or germanium oxide (GeO). The sub-oxide layer 120 may have a thickness of between about 0.1 nm and about 3 nm, such as about 0.2 nm. In other embodiments, the thickness may be greater than about 3 nm or less than about 1 nm, such as less than about 0.1 nm. The sub-oxide layer 120 may form, for example, on a substrate that is exposed to an oxygen-containing environment. Some conventional cleaning techniques are unable to adequately remove the sub-oxide layer 120 from a substrate.

The native oxide layer 130 may include one or more dioxides. For example, the native oxide layer 130 may include at least one of silicon dioxide ($SiO_2$) or germanium dioxide ($GeO_2$). The sub-oxide layer 120 may have a thickness of between about 0.1 nm and about 3 nm, such as about 0.2 nm. In other embodiments, the thickness may be greater than about 3 nm or less than about 1 nm, such as less than about 0.1 nm. The native oxide layer 130 may form, for example, on a substrate that is exposed to an oxygen-containing environment. In some embodiments, the substrate 100 does not have a layer positioned above the native oxide layer 130 prior to processing.

FIG. 1B is a schematic cross-sectional view of one embodiment of the substrate of FIG. 1A that has been cleaned according to one or more embodiments disclosed herein. As shown, the sub-oxide layer 120 and the native oxide layer 130 have been completely removed. In other embodiments disclosed herein, some portion of the sub-oxide layer 120 and/or the native oxide layer 130 may remain on the substrate 100.

FIG. 1C is a schematic cross-sectional view of one embodiment of the substrate of FIG. 1B that has been processed according to embodiments disclosed herein. In some embodiments, a deposited layer 140 may be formed on a surface of the substrate 100, such as the first surface 115, after the substrate 100 has been cleaned.

Figure 2:
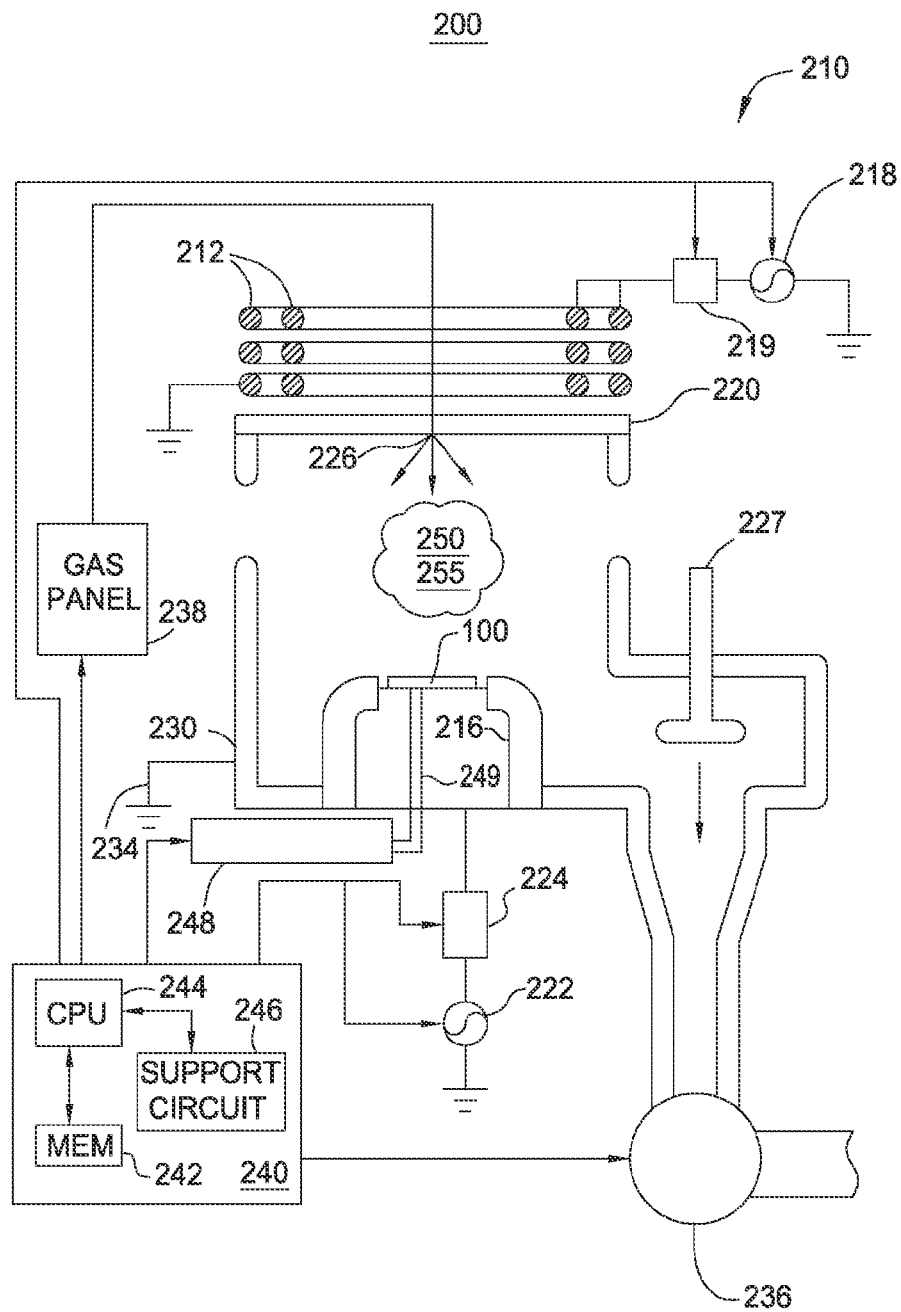
FIG. 2 is a schematic cross-sectional view of an apparatus for processing a substrate, according to one embodiment.

FIG. 2 is a schematic cross-sectional view of a processing reactor for cleaning a substrate, according to one embodiment. As shown, the reactor 200 is an inductively coupled plasma reactor. Other embodiments may use other reactors, such as capacitively coupled plasma reactors, hotwire chemical vapor deposition chambers, electronic cyclotron resonance source (ECR source) chambers, chambers coupled to a remote plasma source, or other types of reactors.

The reactor 200 comprises a process chamber 210 having a substrate support pedestal 216 within conductive walls 230, and a controller 240. The chamber 210 shown is supplied with a dielectric ceiling 220. Above the ceiling 220 is disposed an antenna comprising at least one inductive coil element 212 (two co-axial coil elements 212 are shown). The coil element 212 is coupled, through a first matching network 219, to a plasma power source 218. The power source 218 may be any suitable power source. In some embodiments, the power source is an RF power source. In some embodiments, the power source is capable of producing up to 3000 W at a tunable frequency in a range of about 10 kHz to about 100 MHz. In some embodiments, the power source 218 operates at a frequency in the range of about 50 kHz to about 60 MHz, or at a frequency of about 2 MHz, 13.56 MHz, 40 MHz or 60 MHz.

The pedestal 216 is coupled, through a second matching network 224, to a biasing power source 222. The pedestal 216 may function as a cathode. The biasing power source 222 is generally capable of producing a RF signal having a tunable frequency in the range of about 10 kHz to about 100 MHz. In some embodiments, the frequency is in the range of about 50 kHz to about 60 MHz, or about 2 MHz, 13.56 MHz, 40 MHz or 60 MHz. The biasing power source 222 can operate at a power of between 0 and 5000 Watts. However, it may be disconnected during processing. Optionally, the biasing power source 222 may be a DC or pulsed DC source. A controller 240 comprises a central processing unit (CPU) 244, a memory 242, and support circuits 246 for the CPU 244. The controller 240 facilitates control of the components of the chamber 210 and, as such, of the cleaning or other process.

In operation, a substrate, such as the substrate 100, is placed on the pedestal 216 and process gases are supplied from a gas panel 238 through entry ports 226 to form a gaseous mixture 250. The gaseous mixture 250 is ignited into a plasma 255 in the chamber 210 by applying power from the power source 218. The pressure within the interior of the chamber 210 is controlled using a throttle valve 227 and a vacuum pump 236. Typically, the walls 230 are coupled to an electrical ground 234. The temperature of the walls 230 may be controlled using liquid-containing conduits (not shown) that run through the walls 230.

The temperature of the substrate 100 may be controlled by stabilizing a temperature of the pedestal 216. In one embodiment, gas (e.g., helium) from a gas source 248 is provided via a gas conduit 249 to channels (not shown) formed in the pedestal 216 surface under the substrate 100. The gas is used to facilitate heat transfer between the pedestal 216 and the substrate 100. During processing, the pedestal 216 may also be heated by a resistive heater (not shown) within the pedestal 216.

To facilitate control of the reactor 200 as described above, the controller 240 may be one of any form of general-purpose computer processor that can be used in an industrial setting for controlling various chambers and sub-processors. The memory 242, or computer-readable medium, of the CPU 244 may be one or more of readily available memory such as random access memory (RAM), read only memory (ROM), floppy disk, hard disk, or any other form of digital storage, local or remote. The support circuits 246 are coupled to the CPU 244 for supporting the processor in a conventional manner. These circuits include cache, power supplies, clock circuits, input/output circuitry and subsystems, and the like. The methods disclosed herein are generally stored in the memory 242 as a software routine.

Figure 3:
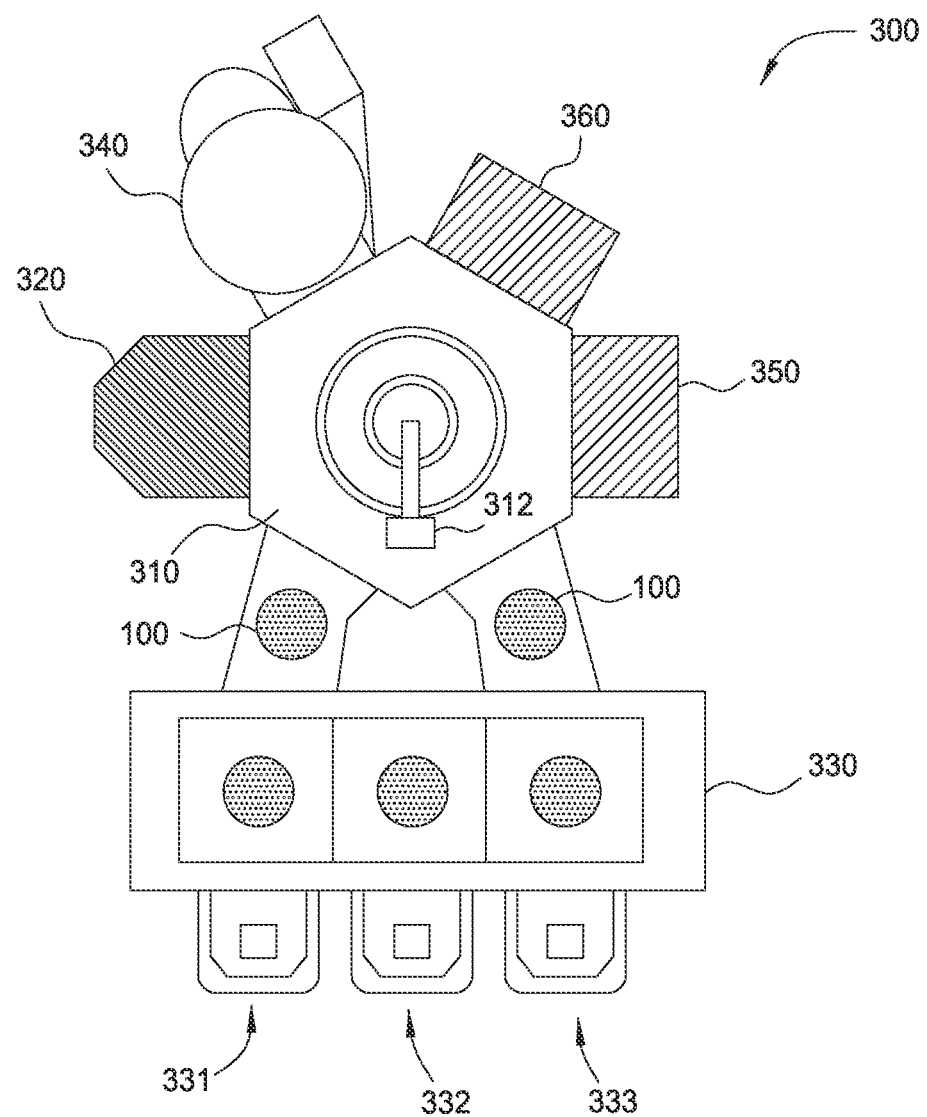
FIG. 3 is a schematic view of a processing system in accordance with one or more embodiments disclosed herein.

In some embodiments, the substrate 100 may not be exposed to an oxygen-containing environment between the stages of the method 400 (described below). By avoiding exposing the substrate 100 to an oxygen-containing environment between processing stages, any contamination of the substrate 100 between processing stages can be minimized or avoided. In some embodiments, each of the stages of the method 400 are performed in separate processing chambers with each chamber connected to a centralized transfer chamber, as shown in FIG. 3 below. The substrate 100 can be moved between the individual processing chambers by a robot without exposure to an oxygen-containing environment or other atmospheric impurities.

FIG. 3 is a schematic view of a processing system 300 in accordance with one or more embodiments disclosed herein. As shown, processing system 300 is a cluster tool. In other embodiments, the processing system may have a different design. Two representative cluster tools that may be adapted for the present disclosure are the Centura® and the Endura®, both available from Applied Materials, Inc., of Santa Clara, Calif.

The processing system 300 includes a central transfer chamber 310 coupled to chambers 320, 340, 350, 360 and load lock 330. The load lock 330 may be connected to a front of the transfer chamber 310. The load lock 330 forms a barrier between the central transfer chamber 310 and an ambient environment. The load lock 330 may include multiple sections 331, 332, 333, which may be used concurrently. The transfer chamber 310 may house a robot 312 that can shuttle substrates 100 between and among the chambers 320, 340, 350, 360 and the load lock 330.

The transfer chamber 310 may be maintained at a vacuum condition. Inert gases may be present in the chambers 320, 340, 350, 360 and/or the transfer chamber 310. In some embodiments, an inert gas is used before and/or after processing as a purge gas to remove some or all of the reactants from the chamber 320, 340, 350, 360.

In some embodiments, one or more of the chambers 320, 340, 350, 360 are the reactor 200. In other embodiments, one or more of the chambers 320, 340, 350, 360 may be another type of plasma enhanced chemical vapor deposition (PECVD) chamber, an epitaxial growth chamber, a pre-clean chamber, an etch camber, another type of deposition chamber, or other chamber.

Figure 4:
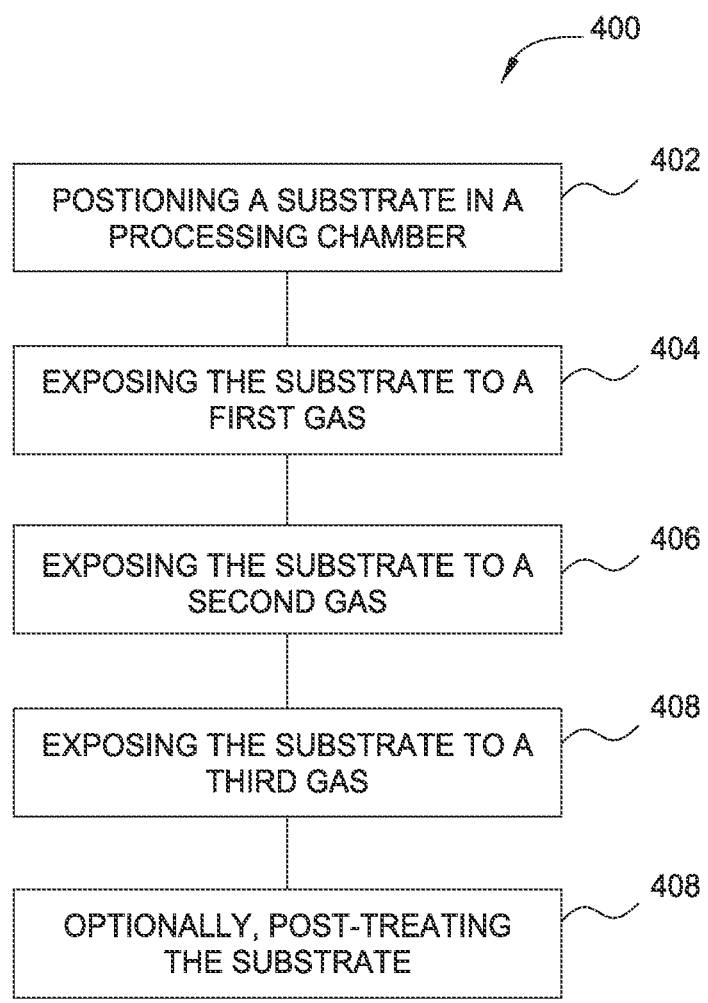
FIG. 4 is a flow diagram of one method for processing a substrate.

FIG. 4 is a flow diagram of a representative method 400 of processing a substrate, such as the substrate 100. In general the method 400 include positioning a substrate in a processing chamber (stage 402), exposing the substrate to a first plasma (stage 404), exposing the substrate to a second plasma (stage 406), exposing the substrate to a gas (stage 408), and optionally post-treating the substrate (stage 410). The method 400 has multiple stages. The stages can be carried out in any order or simultaneously (except where the context excludes that possibility). The method can include one or more other stages which are carried out before any of the defined stages, between two of the defined stages, or after all the defined stages (except where the context excludes that possibility). Not all embodiments include all the stages. Embodiments may or may not include an inert gas purge and/or pump down of the processing chamber or processing chambers before and/or after each stage.

At stage 402, a substrate is positioned in a processing chamber. The substrate may be the substrate 100 as described above in relation to FIG. 1A. The processing chamber may or may not be part of a processing system. In some embodiments, the processing chamber is the reactor 200. In some embodiments, the reactor 200 is part of the processing system 300 or other processing system.

At stage 404, the substrate 100, including at least some of the layers thereon, is exposed to a first plasma generated from a first gas. For example, at least one of the substrate layer 110, the sub-oxide layer 120, or the native oxide layer 130 may be exposed to the first plasma. The first gas may comprise at least one of hydrogen ($H_2$) or a hydrogen compound. Representative hydrogen compounds include at least one or more of hydrogen chloride (HCl), methane ($CH_4$), ammonia ($NH_3$), other similar gases, and mixtures thereof. In some embodiments, the first gas comprises $H_2$ and at least one chlorine-containing gas. Representative chlorine-containing gases include chlorine ($Cl_2$), HCl, silicon tetrachloride ($SiCl_4$), other similar gases, and mixtures thereof. The first gas may also comprise one or more inert gases, such as argon (Ar), helium (He), xenon (Xe), other similar gases, or mixtures thereof. In one embodiment, the first gas includes $H_2$, HCl and Ar. In another embodiment, the first gas includes $H_2$, $Cl_2$, and Ar.

The one or more gases comprising the first gas may be provided from the gas panel 238 through entry ports 226 and into the chamber 210. In an embodiment for cleaning a 300 mm substrate using a first gas comprising hydrogen, chlorine, and/or argon, the flow rates of the gases comprising the first gas may be as follows. It is contemplated that the flow rates may be scaled proportionally with the substrate size or chamber volume. The flow rate of hydrogen may be between about 10 sccm and about 1000 sccm, such as between about 50 sccm and about 400 sccm, such as about 300 sccm. The flow rate of chlorine may be between about 1 sccm and about 300 sccm, such as between about 1 sccm and about 100 sccm, such as about 30 sccm. The flow rate of argon may be between about 1 sccm and about 1000 sccm, such as between about 50 sccm and about 300 sccm, such as about 100 sccm.

The processing conditions during stage 404 may be as follows. It is contemplated that the flow rates may be scaled proportionally with the substrate size or chamber volume. The pedestal 216 may be heated to a temperature between about 10° C. and about 400° C., such as between about 20° C. and about 100° C., such as about 30° C. The pressure of the chamber 210 may be between about 5 mTorr and about 300 mTorr, such as between about 10 mTorr and about 150 mTorr, such as about 35 mTorr.

The plasma conditions for a 300 mm substrate may be as follows. The power source 218 may generate a plasma from the first gas by applying an RF power of between about 200 W and about 1200 W, such as between about 400 W and about 800 W, such as about 600 W to the one or more coil elements 212. The power source 218 may supply RF power at a frequency of, for example, about 13.56 MHz. In some embodiments, the biasing power source 222 may apply a bias power. For example, the biasing power source 222 may apply a pulsed DC power of between about 1 W and about 50 W, such as between about 1 W and about 30 W, to the pedestal 216. The ion energy of the first plasma may be between about 1 eV and about 100 eV, such as between about 5 eV and about 50 eV, such as about 15 eV. In some embodiments, the ion energy of the first plasma is controlled to less than about 20 eV. In some embodiments, the ion energy of the first plasma is controlled to less than about 15 eV.

Although not intending to be limited by theory, it is believed that the first plasma breaks Si—Si bonds, Si—Ge bonds, or Ge—Ge bonds, such as Si—Si bonds, Si—Ge bonds, or Ge—Ge bonds in the substrate layer 110. It is believed that the first plasma saturates any Si or Ge dangling bonds, such as in the sub-oxide oxide layer 120, to form $SiOH_x$, $SiOCl_x$, $GeOH_x$ and/or $GeOCl_x$. The $SiOH_x$, $SiOCl_x$, $GeOH_x$ and/or $GeOCl_x$ can be removed thermally at a much lower temperature and more easily than the sub-oxide.

At stage 406, the substrate 100, including at least some of the layers thereon, is exposed to a second plasma generated from a second gas. For example, at least one of the substrate layer 110, the sub-oxide layer 120, or the native oxide layer 130 may be exposed to the second plasma. Stage 406 may be performed in the same processing chamber as the stage 404. In an embodiment using the same processing chamber for both stage 404 and stage 406, the processing chamber may or may not be purged and/or pumped down before beginning stage 406. In other embodiments, the substrate 100 is transferred to a second processing chamber. For example, in one embodiment, stage 404 is performed in the chamber 320, configured as reactor 200 above. Thereafter, the substrate 100 may be transferred to a second processing chamber, such as the chamber 360 by the robot 312. The chamber 360 may also be configured like reactor 200 above.

The second gas may include at least one nitrogen compound. The nitrogen compound may include, for example, one or both of ammonia and nitrogen trifluoride ($NF_3$). In some embodiments, the second gas may additionally or alternatively include sulfur hexafluoride ($SF_6$). In some embodiments, the second gas includes one or more inert gases, such as argon, helium, xenon, other similar gases, or mixtures thereof. For example, in one embodiment, the second gas includes $NH_3$, $NF_3$, and Ar.

The one or more gases comprising the second gas may be provided from the gas panel 238 through entry ports 226 and into the chamber 210. In an embodiment for cleaning a 300 mm substrate using a second gas comprising $NH_3$, $NF_3$, and Ar, the flow rates of the gases comprising the second gas may be as follows. It is contemplated that the flow rates may be scaled proportionally with the substrate size or chamber volume. The flow rate of $NH_3$ may be between about 5 sccm and about 500 sccm, such as between about 20 sccm and about 100 sccm, such as about 50 sccm. The flow rate of $NF_3$ may be between about 2 sccm and about 100 sccm, such as between about 5 sccm and about 15 sccm, such as about 10 sccm. In some embodiments, the $NH_3$:$NF_3$ flow rate ratio may be between about 3:1 and about 25:1. The flow rate of Ar may be between about 100 sccm and about 2000 sccm, such as between about 50 sccm and about 1200 sccm, such as about 1000 sccm.

The processing conditions during stage 406 may be as follows. The pedestal 216 may be heated to a temperature of greater than 200° C. For example, the temperature may be between about 10° C. and about 60° C., such as between about 20° C. and about 50° C., such as about 30° C. The pressure of the chamber 210 may be between about 100 mTorr and about 4000 mTorr, such as between about 200 mTorr and about 900 mTorr, such as about 400 mTorr. The substrate 100 may be processed for less than about one minute. For example, the substrate 100 may be processed between about 30 seconds and about 60 seconds, such as between about 45 seconds and about 60 seconds. In other embodiments, the substrate 100 may be process for more than about 60 seconds.

The plasma conditions for a 300 mm substrate may be as follows. It is contemplated that the flow rates may be scaled proportionally with the substrate size or chamber volume. The power source 218 may generate a plasma from the second gas by applying an RF power of between about 100 W and about 1200 W, such as between about 200 W and about 400 W, such as about 250 W to the one or more coil elements 212. The power source 218 may supply RF power at a frequency of, for example, about 13.56 MHz. In some embodiments, the biasing power source 222 may apply a bias power. For example, the biasing power source 222 may apply a pulsed DC power of between about 1 W and about 100 W, such as between about 1 W and about 30 W, to the pedestal 216. Although not intending to be limited by theory, it is believed that the second plasma removes all or substantially all of the native oxide layer 130 on the substrate 100.

At stage 408, the substrate 100, including at least some of the layers thereon, is exposed to a third gas. For example, at least one of the substrate layer 110, the sub-oxide layer 120, or any residual native oxide layer 130 may be exposed to the third gas. Stage 408 may be performed in the same processing chamber as the stage 406. In an embodiment using the same processing chamber for both stage 408 and stage 406, the processing chamber may or may not be purged and/or pumped down before beginning stage 408. In other embodiments, the substrate 100 is transferred to a second processing chamber. For example, in one embodiment, stage 406 is performed in the chamber 360, configured as reactor 200 above. Thereafter, the substrate 100 may be transferred to a second processing chamber, such as the chamber 350 by the robot 312. The chamber 350 may also be configured like reactor 200 above.

The third gas may include a chlorine-containing gas. Representative chlorine-containing gases include $Cl_2$, HCl, $SiCl_4$, other similar gases, and combinations thereof. In some embodiments, the third gas may include an inert gas, such as nitrogen, argon, helium, other similar gases, or mixtures thereof. In some embodiments, the third gas includes $N_2$ and $Cl_2$. In other embodiments, the third gas includes $N_2$ and HCl. In still other embodiments, the third gas includes $H_2$ and HCl.

The third gas may be provided from the gas panel 238 through entry ports 226 and into the chamber 210. In an embodiment for cleaning a 300 mm substrate with a third gas comprising chlorine, HCl, and nitrogen, the flow rates of the gases comprising the third gas may be as follows. It is contemplated that the flow rates may be scaled proportionally with the substrate size or chamber volume. The flow rate of chlorine may be between about 5 sccm and about 200 sccm, such as between about 10 sccm and about 50 sccm, such as 20 sccm. The flow rate of HCl may be between about 5 sccm and about 300 sccm, such as between about 20 sccm and about 150 sccm, such as about 50 sccm. The flow rate of nitrogen may be between about 1000 sccm and about 40000 sccm, such as between about 10000 sccm and about 2000 sccm, such as about 30000 sccm.

The processing conditions during stage 408 may be as follows. The pedestal 216 may be heated to a temperature between about 200° C. and about 900° C., such as between about 300° C. and about 500° C., such as about 400° C. The pressure of the chamber 210 may be between about 10 mTorr and about 100000 mTorr, such as between about 3000 mTorr and about 20000 mTorr, such as about 7000 mTorr. The substrate 100 may be processed for between about 5 seconds and about 100 seconds, such as between about 10 seconds and about 50 seconds. Although not intending to be limited by theory, it is believed that the third gas removes all or substantially all of the remaining sub-oxide layer 120 on the substrate 100. After exposing the substrate 100 to the third gas, the substrate 100 may be substantially as described above in relation to FIG. 1B, with both native and sub-oxide layers 120, 130 removed.

At optional stage 410, the substrate 100 is post-treated. Stage 410 may be performed in the same processing chamber as the stage 408. In an embodiment using the same processing chamber for both stage 408 and stage 410, the processing chamber may or may not be purged and/or pumped down before beginning stage 408. In other embodiments, the substrate 100 is transferred to a second processing chamber. For example, in one embodiment, stage 408 is performed in the chamber 350, configured as reactor 200 above. Thereafter, the substrate may be transferred to a different processing chamber, such as the chamber 340, by the robot 312. The chamber 340 may also be configured like reactor 200 above. In other embodiments, the chamber 340 is configured differently, such as like one of the other chambers described above in relation to FIG. 3.

In some embodiments of the stage 410, a layer 140 is deposited on the substrate 100, such as on the first surface 115 of the substrate 100. After the completion of this embodiment of stage 410, the substrate 100 may resemble the substrate 100 depicted in FIG. 1C.

In one embodiment, the stage 410 may be performed in the chamber 340. In one embodiment, the chamber 340 is an epitaxial growth chamber. The epitaxial growth chamber may be, for example, a CENTURA® RP Epi chamber available from Applied Materials, Inc., of Santa Clara, Calif. In one embodiment, the layer 140 may be an epitaxial semiconductor layer. For example, the layer 140 may be an epitaxial germanium layer, an epitaxial silicon germanium layer, or an epitaxial III-V semiconductor layer. Representative III-V semiconductor layers include boron nitride, boron phosphide, boron arsenide, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, and others.

The previously described embodiments have many advantages, including the following. The methods disclosed herein result in a high quality substrate surface for epitaxial growth. For example, the substrate may have a surface oxygen concentration of less than about $1.30 \times 10^{11}$ (atoms)/$cm^2$. Furthermore, the methods disclosed herein can remove oxygen from the surface of a SiGe substrate without altering the stoichiometry of the substrate. Furthermore, the methods disclosed herein allow for cleaning a substrate without heating the substrate to a temperature greater than about 500° C. Moreover, the methods disclosed herein are amenable to being integrated with a deposition chamber, such as epitaxial growth chamber of a metal deposition chamber. Additionally, the methods disclosed herein allow for effectively cleaning substrates having small features, such as trenches and contact holes having dimensions of less than about 10 nm. Cleaning substrates with such features is not possible using a wet clean method with HF and a solvent. The aforementioned advantages are illustrative and not limiting. It is not necessary for all embodiments to have all the advantages.

While the foregoing is directed to embodiments of the present disclosure, other and further embodiments of the disclosure may be devised without departing from the basic scope thereof, and the scope thereof is determined by the claims that follow.

The invention claimed is:

1. A method of processing a substrate, the method comprising:
   exposing a substrate having a silicon-containing layer to a first plasma generated from a first gas comprising at least one of hydrogen or a hydrogen compound to saturate a sub-oxide layer with hydrogen to form a saturated sub-oxide layer;
   exposing the substrate to a second plasma generated from a second gas comprising a nitrogen compound to remove a native oxide layer; and
   heating the substrate and exposing the substrate to a third gas comprising at least one of molecular chlorine or a chlorine compound to remove any remaining sub-oxide layer, wherein exposing a substrate to a first plasma occurs before both exposing the substrate to a second plasma and heating the substrate and exposing the substrate to a third gas, and wherein exposing the substrate to a second plasma occurs before heating and exposing the substrate to a third gas.

2. The method of claim 1, wherein the substrate comprises silicon, a germanium, or a silicon-germanium.

3. The method of claim 1, wherein the first gas comprises one or more of hydrogen, methane, ammonia, silicon tetrachloride, chlorine, or hydrogen chloride.

4. The method of claim 3, wherein an ion energy is controlled to below 20 eV during the exposing a substrate to a first plasma.

5. The method of claim 1, wherein the second gas comprises $NH_3$ and $NF_3$.

6. The method of claim 1, wherein the third gas comprises at least one of chlorine, hydrogen chloride, or silicon tetrachloride.

7. The method of claim 1, wherein heating comprises heating the substrate to a temperature of less than about 500° C.

8. The method of claim 1, wherein:
   the second gas comprises $NH_3$ and $NF_3$;
   the third gas comprises one or more of chlorine, hydrogen chloride, or silicon tetrachloride; and
   the heating comprises heating the substrate to a temperature of less than about 500° C.

9. The method of claim 1, wherein the substrate comprises one or more lines, one or more trenches, and/or one or more vias.

10. The method of claim 1, further comprising depositing an epitaxial layer on the substrate.

11. The method of claim 10, wherein the epitaxial layer comprises germanium.

12. The substrate processed by the method of claim 10.

13. The method of claim 1, further comprising depositing an epitaxial layer on the substrate; and
   wherein an ion energy is controlled to below 20 eV during the exposing a substrate to a first plasma;
   wherein the second gas comprises $NH_3$ and $NF_3$;
   wherein the third gas comprises one or more of chlorine, hydrogen chloride, or silicon tetrachloride; and
   wherein the heating a substrate and exposing the substrate to the third gas comprises heating the substrate to a temperature of less than about 500° C.

14. A method of processing a substrate, the method comprising:
   positioning a substrate in a processing chamber, the substrate comprising:
      a substrate layer;
      a sub-oxide layer positioned above the substrate layer; and
      a native oxide layer positioned above both the substrate layer and the sub-oxide layer;
   removing the native oxide layer; and
   selectively removing the sub-oxide layer.

15. The method of claim 14, wherein removing the native oxide layer comprises heating the substrate to a temperature of less than about 500° C.

16. The method of claim 14, wherein the substrate is a silicon substrate, a germanium substrate, or a silicon-germanium substrate, and wherein the substrate has features having a size of less than about 10 nm.

17. The substrate processed according to claim 16.

* * * * *